United States Patent [19]
Cory et al.

[11] Patent Number: 5,343,151
[45] Date of Patent: Aug. 30, 1994

[54] METHOD FOR AUTOMATICALLY SHIMMING A HIGH RESOLUTION NMR MAGNET

[75] Inventors: David G. Cory, Boston; Peter Sprenger, Lexington, both of Mass.

[73] Assignee: Bruker Instruments, Inc., Billerica, Mass.

[21] Appl. No.: 29,906

[22] Filed: Mar. 11, 1993

[51] Int. Cl.$^5$ ............................................. G01V 3/00
[52] U.S. Cl. ..................................... 324/320; 324/319
[58] Field of Search ............... 324/320, 319, 318, 322, 324/307, 309; 128/653.5

[56] References Cited

U.S. PATENT DOCUMENTS

| | | | |
|---|---|---|---|
| 4,523,166 | 6/1985 | Gross | 324/320 |
| 4,740,753 | 4/1988 | Glover et al. | 324/320 |
| 4,761,614 | 8/1988 | Prammer et al. | 324/320 |
| 4,899,109 | 2/1990 | Tropp et al. | 324/320 |
| 4,949,044 | 6/1989 | Starewicz et al. | 324/320 |
| 5,006,804 | 4/1991 | Dorri et al. | 324/320 |
| 5,121,060 | 6/1992 | Doddrell et al. | 324/320 |

OTHER PUBLICATIONS

Poster at the International Conference on NMR Microscopy, Heidelberg, Germany, Sep. 16–19, 1991.
Chmurny et al., The Ancient and Honourable Art of Shimming, Concepts in Magnetic Resonance, vol. 2, pp. 131–149, 1990.
Cory et al., Chemical-Shift-Resolved Back-Projection Imaging, Journal of Magnetic Resonance, vol. 85, pp. 219–227, 1989.

*Primary Examiner*—Louis Arana
*Attorney, Agent, or Firm*—Cesari and McKenna

[57] ABSTRACT

A plurality of measurements are made with a probe containing a material sample with a known frequency spectrum. The probe is positioned in one spot in the magnet bore in the presence of a field gradient along a predetermined axis. Prior to each measurement, the gradient strength is increased by a predetermined constant amount. The resulting measurement values are mathematically manipulated to yield a set of values which can be used to set the shim coil currents based on known equations for the field generated by each shim coil. The method can be used with a material sample with a simple NMR spectrum or a complex NMR spectrum. If a sample with a complex NMR spectrum is employed in the measurement, the spectral complexity can be removed by deconvolution during the manipulation of the measurement values.

25 Claims, 11 Drawing Sheets

METHOD FOR AUTOMATICALLY SHIMMING A HIGH RESOLUTION NMR MAGNET

FIELD OF THE INVENTION

This invention relates to NMR spectroscopy and NMR imaging and, in particular to a method for automatically adjusting currents in shim coils in order to correct the homogeneity of the NMR static magnetic field using field measurements made with an NMR probe.

Background of the Invention

All atomic nuclei of elements with an odd atomic mass or an odd atomic number possess a nuclear magnetic moment. Nuclear magnetic resonance (NMR) is a phenomenon exhibited by this select group of atomic nuclei (termed "NMR active" nuclei), and is based upon the interaction of the nucleus with an applied external magnetic field. The magnetic properties of a nucleus are conveniently discussed in terms of two quantities: the magnetogyric ratio ($\gamma$); and the nuclear spin (I). When an NMR active nucleus is placed in a magnetic field, its nuclear magnetic energy levels are split in to $(2I+1)$ non-degenerate energy levels, which are separated from each other by an energy difference that is directly proportional to the strength of time applied magnetic field. This splitting is called the "Zeeman" splitting and the energy difference is equal to $\gamma h H_0/2\pi$, where h is Plank's constant and $H_0$ is the strength of the applied magnetic field. The frequency corresponding to the energy of the Zeeman splitting ($\omega_0 = \gamma H_0$) is called the "Larmor frequency" and is proportional to the field strength of the magnetic field. Typical NMR active nuclei include $^1H$(protons), $^{13}C$, $^{19}F$, and $^{31}P$. For these four nuclei $I=\frac{1}{2}$, and each nucleus has two nuclear magnetic energy levels.

When a bulk sample of material containing NMR active nuclei is placed within a magnetic field called the main static field, the nuclear spins distribute themselves amongst the nuclear magnetic energy levels in accordance with Boltzmann's statistics. This results in a population imbalance among the energy levels and a net nuclear magnetization. It is this net nuclear magnetization that is studied by NMR techniques.

At equilibrium, the net nuclear magnetization of the aforementioned bulk sample is aligned parallel to the external magnetic field and is static (by convention, the direction of the main static field is taken to be the Z-axis). A second magnetic field perpendicular to the main static magnetic field and rotating at, or near, the Larmor frequency can be applied to induce a coherent motion of the net nuclear magnetization. Since, at conventional main static magnetic field strengths, the Larmor frequency is in the megahertz frequency range, this second magnetic field is called a "radio frequency" or RF field.

The effect of the RF field is to shift the nuclear magnetization direction so that it is no longer parallel to the main static field. This shift introduces a net coherent motion of the nuclear magnetization about the main static field direction called a "nutation". In order to conveniently deal with this nutation, a reference frame is used which rotates about the Z-axis at the Larmor frequency. In this "rotating frame" the RF field, which is rotating in the stationary "laboratory" reference frame, is static. Consequently, the effect of the RF field is to rotate the now static nuclear magnetization direction at an angle with respect to the main static field direction. The RF field is typically applied in pulses of varying length and, by convention, an RF field pulse of sufficient length to rotate the nuclear magnetization in the rotating frame through an angle of 90°, or $\pi/2$ radians, is called a "$\pi/2$ pulse".

A $\pi/2$ pulse applied with a frequency near the nuclear resonance frequency will rotate the nuclear magnetization from an original direction along the main static magnetic field direction into a plane perpendicular to the main magnetic field direction. Because the RF field and the nuclear magnetization are rotating, the component of the nuclear magnetization that is transverse to the main magnetic field precesses about the external magnetic field at the Larmor frequency. This precession can be detected with a receiver coil that is resonant at the precession frequency and placed such that the precessing magnetization induces a voltage across the coil. Frequently, the "transmitter coil" employed for applying the RF field to the sample and the "receiver coil" employed for detecting the magnetization are one and the same coil.

In addition to precessing at the Larmor frequency, in the absence of the applied RF field energy, the nuclear magnetization also undergoes two spontaneous processes: (1) the precessions of various individual nuclear spins which generate the net nuclear magnetization become dephased with respect to each other so that the magnetization within the transverse plane loses phase coherence (so-called "spin-spin relaxation") with an associated relaxation time, $T_2$, and (2) the individual nuclear spins return to their equilibrium population of the nuclear magnetic energy levels (so-called "spin-lattice relaxation") with an associated relaxation time, $T_1$.

The nuclear magnetic moment experiences an external magnetic field that is reduced from the actual field due to a screening from the electron cloud. This screening results in a slight shift in the Larmor frequency (called the "chemical shift" since the size and summetry of the shielding is dependent on the chemical composition of the sample).

Since the Larmor frequency of the NMR resonance is directly proportional to the main static magnetic field, if the applied main static field is homogeneous across the bulk sample, the resulting detected signal, when plotted as amplitude versus frequency will have a linewidth of $1/\pi T_2$, which linewidth is typically on the order of 1 Hz or less for high-resolution NMR studies of liquid samples. For example, in a homogeneous main static field, the resonance line can be less than 0.1 Hz wide at a resonance frequency of up to 600 MHz.

However, any variation in the main static field strength over the volume of the sample will introduce variations in the Larmor frequency in the areas of field strength variation. Since the detected signal is a weighted sum of the individual nuclear spins, these variations appear as a blurring or broadening of the resonance line which causes a loss in spectral resolution of the system. In order to avoid such a loss in spectral resolution due to poor magnet homogeneity, in the example given above, the homogeneity of the magnet should be better than 0.1 Hz/600,000,000 Hz, or better than 1 part in $10^9$.

In conventional NMR apparatus, the main magnetic field is generated by a superconducting solenoid magnet having a room-temperature bore in which the field is produced. High homogeneity is typically achieved in at least a volume of the magnet bore both by carefully constructing the main magnet windings to yield a uniform field within the volume, and by including a set of "shim" coils inside the magnet which shim coils can be adjusted to generate small magnetic fields of various geometries which then add to the main magnetic field. If a sufficient number of shim coils of different geometry are included and if they are correctly adjusted then the necessary field homogeneity of the overall field can be achieved. Such a set of shim coils might, for example, include eighteen or more separate coils.

Previously, the process for adjusting the shim coil currents, which process was called "shimming" the main magnet, involved adjusting the individual shim coil currents either manually or under computer control iteratively and successively. The resulting magnetic field was measured within the magnet bore by inserting a small sample with a known NMR response and observing the NMR signal. The process was then repeated in an attempt to find the set of shim coil current values which produced the most homogeneous field. This conventional method works well when the main magnetic field is relatively homogeneous before shimming, but when the magnetic field is far from homogeneous there are many pitfalls associated with the method due to the interactions between various shim coils and the time-consuming and tedious nature of the problem.

Much of the difficulty with the prior an approach originates from the fact that, in making the field measurements by observing an NMR signal, either the computer or the operator is monitoring a weighed sum of the field homogeneity and not the actual field homogeneity. For example, in conventional practice, one approach to measuring the field homogeneity is to measure the effective peak amplitude of a pulsed, spin-locked NMR resonance signal. Since, under normal operating conditions, the integrated area of a spin-locked resonance signal is constant, so as the field homogeneity is improved, the observed resonance line width decreases and the peak amplitude increases. Thus, the best field homogeneity is achieved when the peak amplitude reaches a maximum.

However, as mentioned above, the observed resonance line is the superposition of a continuum of separate resonance lines, each of which is produced from a distinct region of the magnetic field and, due to the field inhomogeneity, the NMR signal produced from each region may differ from other regions. Consequently, as the shim currents are adjusted, many local or false maximums in the peak amplitude are encountered and operator experience is required to both recognize this fact and to progress from a local maximum to the ultimate maximum.

An alternative prior art approach is to adjust the shim currents based on the observation of an NMR signal which is the time-domain response to an excitation pulse (a free induction decay or FID). Since the modulation envelope of this NMR signal reflects the shape of the resonance in the frequency space, more information is available and a trained operator can move more directly in the direction of the optimal shimming. Here, however there is too much information and only the most gross errors are easily identified and corrected.

Other known methods of shimming the magnet have relied on mapping out the magnetic field variation within the magnet bore by either an NMR imaging technique or by repositioning a small sample at various points within the magnetic field and measuring the variation in resonance frequencies. These methods work well for shimming the magnet with the shimming measurement probe in place, however, in order to perform the actual NMR experiments, the shimming measurement probe must be replaced with a high-resolution probe and, in high-resolution solution-state spectroscopy, the NMR high-resolution probe and, indeed, the sample itself have a large influence on the magnetic field homogeneity (due to local variations in the bulk susceptibility of the materials used in the high-resolution probe and of sample). Therefore, once the shimming measurement probe is replaced with the high-resolution probe, the magnet must be re-shimmed. To a lesser extent the magnet must be re-shimmed for each individual sample.

Accordingly, it is an object of the present invention to provide a method for automatically adjusting the shim coil currents of a magnet to maximize the homogeneity of a magnetic field.

It is a further object to provide a shimming method that is independent of the NMR probe that is employed.

It is a further object to provide a shimming method that is relatively independent of the sample material used.

SUMMARY OF THE INVENTION

The foregoing problems are solved and the foregoing objects are achieved in one illustrative embodiment of the invention in which a magnetic field is measured by recording the NMR spectrum from a conventional high-resolution NMR probe containing a material sample with a predetermined geometry. A plurality of measurements are made with the probe positioned in one spot in the magnet bore in the presence of a field gradient along a predetermined axis. The field gradient may, for example, be created by adjusting the current in one of the shim coils. Prior to each measurement, the gradient strength is increased by a predetermined constant amount. The resulting measurement values are mathematically manipulated to yield a set of values which can be used to set the shim coil currents based on known equations for the field generated by each shim coil. The method can be used with a material sample with a simple NMR spectrum or a complex NMR spectrum. If a sample with a complex NMR spectrum is employed in the measurement, the spectral complexity can be removed by deconvolution during the manipulation of the measurement values.

More particularly, a series of free inductive decays (FIDs) are recorded for the sample with a field gradient generated by an existing field shim coil with the shim coil current incremented by a fixed amount prior to recording each FID. A conventional analysis procedure is employed to generate a 2-dimensional data matrix that plots a spin's spatial location along one axis and the corresponding resonance frequency (in the absence of the shim field) along the other axis. From this data matrix, the variation of the magnetic field along the axis is determined and this information is used to determine the optimal setting of the shim coil currents that yields a homogeneous magnetic field.

DETAILED DESCRIPTION OF THE PREFERRED EMBODIMENT

One of the first steps in the inventive shimming method is to measure the variation of the magnetic field strength in a predetermined direction or along an axis of interest. The inventive method allows correction of the field to a spatially uniform field along this predetermined direction. Since the NMR resonance frequency is directly proportional to the strength of the magnetic field, the resonance frequency can be used as a measure of the field strength. Therefore, measurements of the NMR frequency must be performed as a function of the position in the predetermined direction.

In order to avoid physically moving the NMR probe within the magnet bore in the predetermined direction and making repeated measurements at different physical locations, it is necessary to "encode" each field strength measurement so that the measurements can be separated even though all measurements are made with the probe in a single location and all locations are sampled simultaneously. This encoding is done by introducing a field gradient along the predetermined direction by adding a gradient field to the main field where the gradient field strength linearly increases in the predetermined direction. In an illustrative embodiment of the inventive method, the shim coils that are conventionally present in the magnet are used to generate such a gradient field under computer control. For example, if the direction of interest is along the z-axis direction, then the conventional $z^1$ shim coil can be used to generate a magnetic field with a linearly-increasing magnetic field strength along the z-axis.

With such a gradient field in place, the NMR resonant frequency will increase along the z-axis since the resonant frequency is proportional to the magnetic field strength. Assuming that a z-axis gradient field is used, the spatial dependence of the magnetic field strength resulting from inhomogeneities in the field (which is of interest) and the spatial encoding of the nuclear spin (which is not of interest) both appear as an evolution of the spin magnetization about the z-axis in the rotating frame and, consequently, a method of separating these two evolutions is necessary to observe the inhomogeneities.

Figure 1:
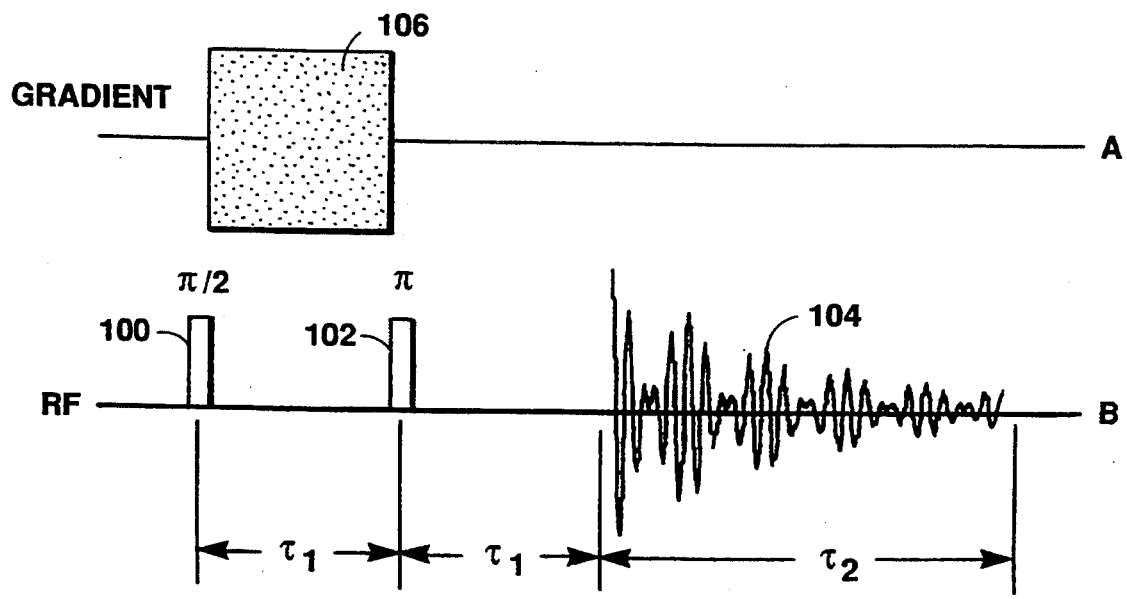
FIG. 1 is a schematic diagram representing a prior art NMR experiment which is used in a conventional two dimensional method of measuring a spatial variation in the magnetic field strength.

A prior art separation technique is illustrated in the NMR experiment shown in FIG. 1. Line A shows the application of the z-axis gradient field and line B shows the application of the RF field. Of course, the main static field is always applied, but not shown. As shown in FIG. 1, the experimental sequence involves applying a $\pi/2$ excitation pulse 100 to the sample and waiting a time interval, $\tau_1$, for phase encoding and then applying a $\pi$ refocussing pulse 102. The gradient field 106 is applied during the phase encoding time interval between the $\pi/2$ pulse 100 and the $\pi$ pulse 102. After an interval of equal time duration ($\tau_1$), an FID 104 is acquired.

As is well-known, a $\pi$ refocussing pulse 102 generates an echo which corresponds to a refocussing of those inhomogeneous interactions that are time independent. The spin echo appears when the encoding periods which occur both before and after the $\pi$ pulse are equal in duration. Therefore, the spin evolution due to the time-independent main magnetic field (and any inhomogeneities) is refocussed, but the spin evolution due to the gradient 106 is not refocussed since it appears only prior to the $\pi$ pulse 102. Thus, the phase encoding period of the experiment (the two $\tau_1$ time intervals) records only the spin evolution due to the linear gradient and the detection period of the experiment (time interval $\tau_2$) records only the spin evolution due to the local magnetic field strength.

Assuming that the gradient is switched on and off within a time interval which is small compared to the relaxation times of the sample, during the evolution time only the spatial dependence of the spin packet that is created by the imposed gradient is important and the main magnetic field strength is suppressed, but during the detection period, only the main magnetic field strength is important and the spatial gradient is suppressed. In accordance with this prior art experiment, the gradient must be switched off during the experiment to accomplish this separation.

Consequently, although such a prior art experiment can be performed with special imaging, or gradient probes which contain a special gradient coil, standard high-resolution NMR probes, which do not contain a gradient coil, cannot be used. Theoretically, an existing shim coil could be used to generate the required gradient and the shim coil current could be switched during an experiment to switch the gradient. However, this operation is unrealistic with present day equipment since NMR spectrometers do not normally include the necessary interface for real-time control of the shim currents, and the switching times of such coils are very long because the coils are not designed for such switching and, therefore, have high inductance and eddy currents.

Figure 2:
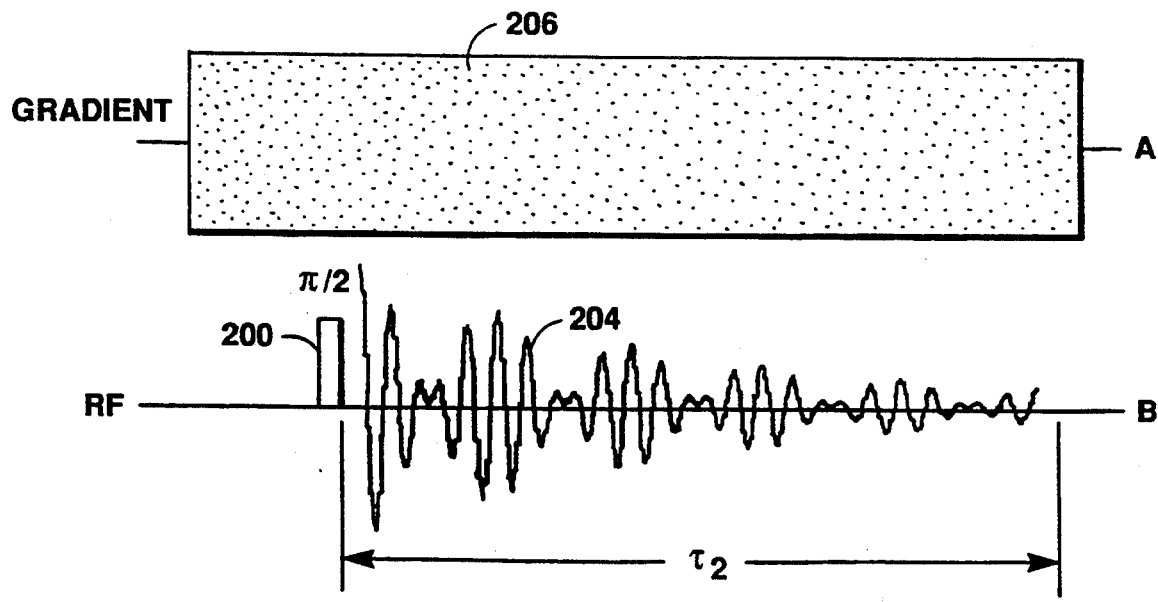
FIG. 2 is a schematic representation of an NMR experiment which is used in the inventive shimming method.

FIG. 2 shows an NMR experiment conducted in accordance with one embodiment of the invention, which experiment accomplishes the same evolution separation as the experiment illustrated in FIG. 1, but avoids gradient switching during the experiment. Line A shows the application of the z-axis gradient field and line B shows the application of the RF field. As with the experiment shown in FIG. 1, the main static field is also present, but not shown. As shown in FIG. 2, the experimental sequence involves applying a $\pi/2$ excitation pulse 200 to the sample and immediately acquiring an FID 204. The gradient field 206 is applied during the entire experiment. A plurality of experiments are performed with the gradient field strength increased between experiments in order to accomplish the desired separation.

After the gradient field strength is increased in preparation for the next experiment, the system is allowed to equilibrate, but the time necessary for equilibration is unimportant since it occurs between experiments and there is no spin evolution during this time. When the magnetic fields have stabilized, another excitation pulse 200 is applied and the next FID 204 is acquired. Because the equilibration time of the system is not critical, it is possible to use existing shim coils to generate the required gradient even though the switching time of such coils is typically long. For example, the $z_1$ shim found in many high-resolution NMR spectrometers can be used to generate the required gradient.

Figure 3:
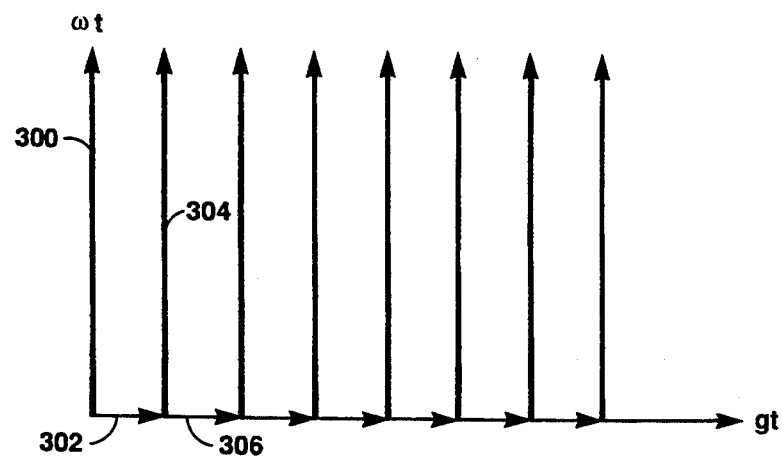
FIG. 3 is a reciprocal space diagram of the data resulting from the experiment outlined in FIG. 1.
Figure 4:
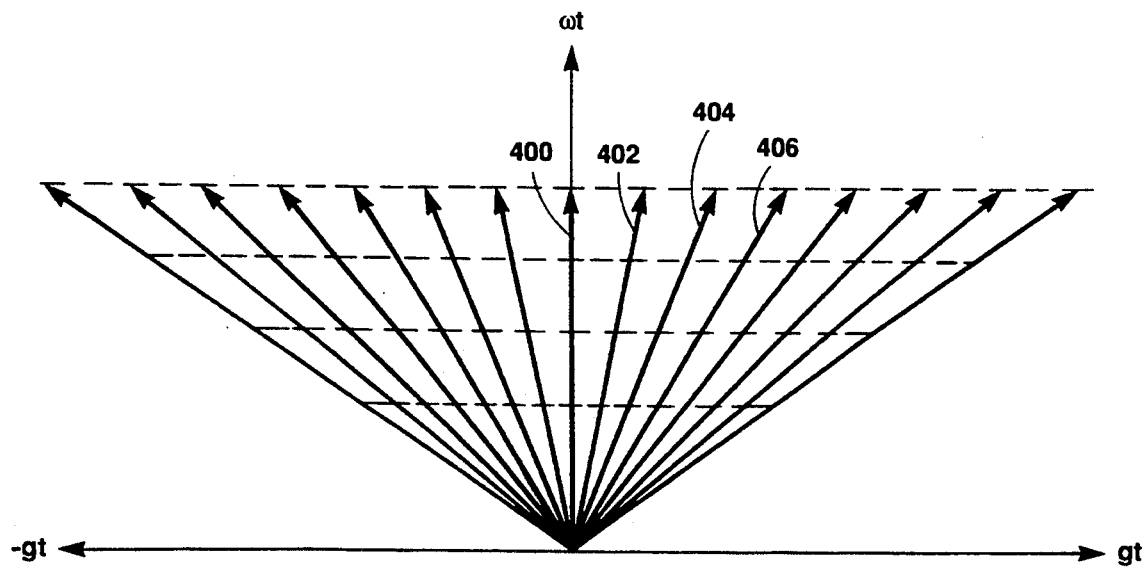
FIG. 4 is a reciprocal space diagram of the data resulting from the experiment outlined in FIG. 2.

The effect of incrementing the gradient field strength is illustrated in FIGS. 3 and 4 which depict the reciprocal space representation of the NMR experiments shown in FIGS. 1 and 2, respectively. Reciprocal space refers to a representation in which the normal coordinates are replaced by the reciprocals. For example, in the present method, the desired two-dimensional result is a mapping of a spin location versus the spin resonant frequency in the absence of the gradient field. The units for the two axes are then distance (cm) versus frequency $(1/\omega t)$. This data matrix is generated by a two-dimensional Fourier transformation of the data as collected in reciprocal space. The units for the two-dimensional reciprocal space are then $cm^{-1}$ versus $(\omega t)$. (time). The gradient can be expressed in units of frequency/cm, so the reciprocal space units for this experiment are gradient strength times time (gt) versus time $(\omega t)$.

In FIGS. 3 and 4, the spatially-dependent spin magnetization evolution (gt) is plotted along the horizontal axis and the spin magnetization evolution due to the local magnetic field $(\omega t)$ is plotted along the vertical axis. FIG. 3 illustrates the alternating pattern of evolution produced by the prior art experiment shown in FIG. 1 and previously discussed.

In particular, during the first part of the experiment, the spin evolution is due entirely to the local magnetic field as illustrated by arrow 300 which parallels the vertical axis. During the second part of the experiment, the spin evolution is due entirely to the spatial gradient as indicated by arrow 302 which parallels the horizontal axis. Repeating the experiment with the gradient incremented between experiments, simply repeats the period of local magnetic field evolution followed by gradient evolution as illustrated by arrows 304 and 306, respectively. Since the spin evolution proceeds entirely on a Cartesian raster, a direct 2-D Fourier transformation will yield the desired frequency versus space data which will enable the spatial variations in the main static field to be measured.

FIG. 4 illustrates a reciprocal space diagram for the experiment illustrated in FIG. 2. Since the spin magnetization evolution due to the local magnetic field variation is no longer separated from the spin magnetization evolution due to the applied gradient, the overall spin magnetization evolution has components of each type of evolution. Arrow 400 represents an experiment in which there is no applied gradient field and shows spin evolution due entirely to the local magnetic field. However, as the experiment is repeated and the strength of the gradient field is increased, a spin magnetization evolution component due to the applied gradient appears. Thus, each successive experiment with the gradient strength increased between each experiment results in a series of spin evolution vectors depicted as arrows 402, 404, 406, etc.

Since the data is now acquired on a fanned-out array as shown in FIG. 4, a data analysis more complicated than a direct 2-D Fast Fourier transformation must be used in order to recover the desired spatial information regarding the spatial variation of the main magnetic field. A discrete two-dimensional Fourier transformation could be used, but this is computationally inefficient and slow, so it is preferable to manipulate the recorded data so that a two-dimensional Fast Fourier transformation can be applied. As will be discussed in detail hereinafter, the data analysis method includes steps which convert the data into a form which lies on a Cartesian raster so that a final 2-D Fourier transformation can be used to yield the desired spatial variation of the main magnetic field.

Figure 5:
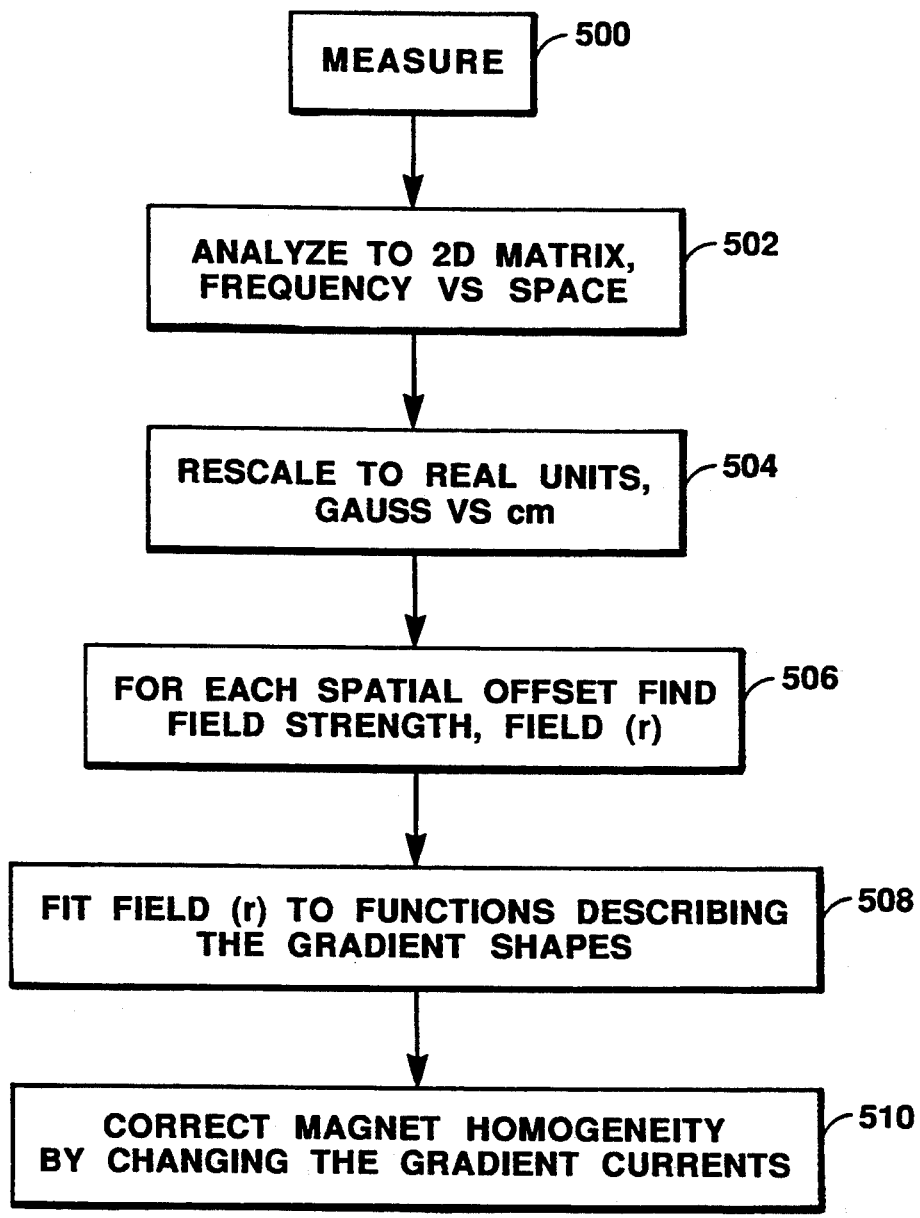
FIG. 5 is a schematic block diagram of the overall inventive shimming method.

The steps constituting the basic method used to collect and manipulate the data are shown in schematic form in FIG. 5. In step 500, initial FID data measurements are taken in a series of experiments described in detail below. As previously mentioned, the applied field gradient is held constant during each experiment and incremented between experiments. The collected data is manipulated to place it into a two-dimensional matrix which represents the data as resonant frequency versus spatial coordinates. This latter manipulation causes the data to be expressed in units which do not correspond to physical quantities. Accordingly, in step 504, the data is rescaled so that it is expressed in units which correspond to actual physical quantities (illustratively, Gauss and centimeters). The rescaled data are then rearranged so that field strength values are determined with respect to spatial position (step 506). In step 508, a mathematical function is derived by fitting a curve to the rearranged data determined in step 506 by means of known techniques. Finally, in step 510, the relationship determined in step 508 is used to adjust the conventional shim coil currents to correct the homogeneity of the main magnetic field.

Figure 6:
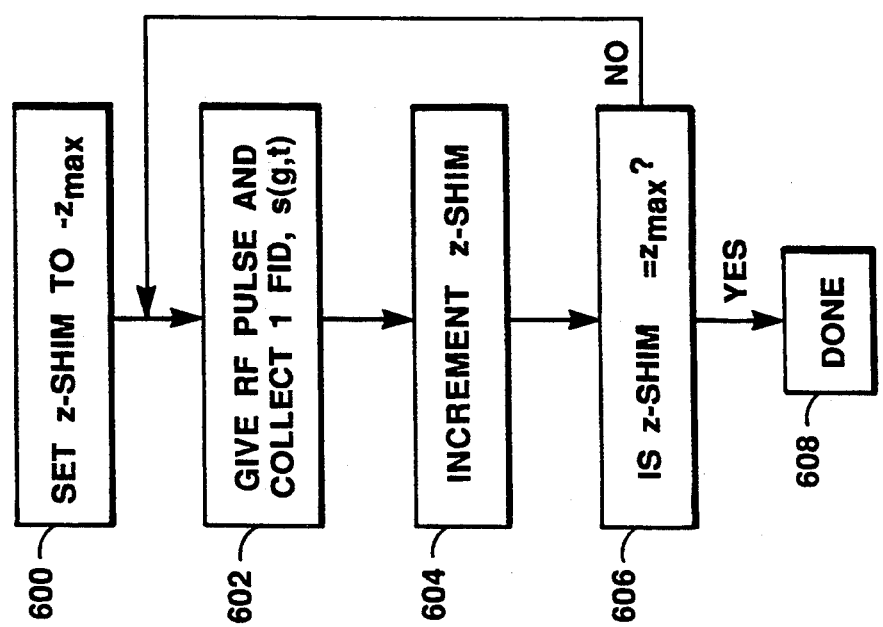
FIG. 6 is a schematic block diagram of the steps involved in the measurement sequence used in the inventive shimming method.

The method of collecting the initial data schematically illustrated in FIG. 5, step 500, is shown in more detail in FIG. 6. In particular, for purposes of illustration, the gradient field is applied along the z-axis by using an existing z-shim in the NMR spectrometer. As previously mentioned, in accordance with one aspect of the invention, use of this shim is possible because current switching through the shim coil takes place between experiments, not during an experiment. In addition, the inventive method requires that a sufficient number of experiments be run so that experiments can be run with the gradient both increasing and decreasing along the direction of interest.

The illustrative measurement method begins in step 600 in which the z-shim current is set to its maximum strength, denoted as $-z_{max}$, so that the gradient strength developed by the z-shim reaches a maximum in the $-z$ direction. In step 602, a measurement is made by placing a probe containing an NMR-active sample with a known frequency spectrum in a predetermined position in the main static field (generally the field center). Although not necessary, it is advantageous if the sample is spun to eliminate interactions with poorly adjusted off-axis shim coil fields. An RF $\pi/2$ excitation pulse is applied in a conventional manner and the resulting FID is recorded and denoted as s(g,t), where g represents the gradient field strength and t represents time. In order to simplify the data processing as described below, the FID can be collected "on-resonance". It is also possible to run the experiment "off-resonance", but the resulting field plot will have an offset that increases the difficulty of the data processing. Next, the z-shim current is incremented in step 604, resulting in an decrease in the gradient strength in the $-z$ direction (the direction opposition to the direction of the main static field. The z-shim current is compared to the maximum z-shim current, $+z_{max}$, in step 606. If the z-shim current is less than the maximum current, the method proceeds to step 602 where another FID is acquired. Alternatively, if the incremented z-shim current is greater than the maximum z-shim current, $+z_{max}$, then the method proceeds to step 608 in which the measurement routine is finished. Since the FIDs are always acquired as functions of time, each data acquisition takes place along one of the various vectors which fan out along the gt axis away from the $\omega_o t$ axis as the strength of the gradient field is increased as shown in FIG. 4.

In accordance with one aspect of the invention, it has been found that a transposition of the data matrix shown in FIG. 4 produces a set of spectra whose frequency response depends only on the spatial properties of the sample, and whose phase is related to the chemical shift. These latter two interactions can then be separated by a 2-D Fourier analysis. Specifically, following an excitation pulse the nuclear spins in the sample precess due to two important interactions: (1) the Larmor frequency which is a direct measure of the local magnetic field strength, and (2) the field gradient generated by the shims which is a spatially linearly increasing field. After the data are collected, the data matrix is transposed to yield a set of "pseudo" FIDs that are recorded at a constant time but for which the shim values vary from point to point. Constant time refers to a constant time interval between the application of an excitation pulse and the collection of a data point.

Since, for each data point in the pseudo FID, the time evolution is constant, the precession due to Larmor frequency is also constant (for each spin packet) and appears as a phase shift. On the other hand, the gradient evolution is incremented from point to point and so this evolution encodes a spatially-dependent frequency onto the data set. By Fourier transforming these pseudo FIDs as a function of the gradient strength, a set of data are obtained with a scaled spatial domain and a time domain that is modulated by the frequency due to local variations in the magnet field strength.

The spatial domain is scaled by the time interval over which the gradient evolution has occurred. This scaling is removed by rescaling by a factor of 1/time to yield a matrix with a true spatial scale along one axis and an FID along the other axis, which FID is modulated by the resonance frequency at the spatial location. This rescaling is accomplished by interpolation. A second Fourier transformation returns a matrix of space versus resonance frequency. In this way the field strength as a function of position can be mapped out along an axis.

The frequency per position is then measured and fit to a set of polynomials that correspond to the known shape of the gradients. Since the relationship between the gradients and the shim coil currents is known, the currents through the shim coils can then be adjusted to cancel out the main field variation, leaving a uniform magnetic field.

Figure 7A:
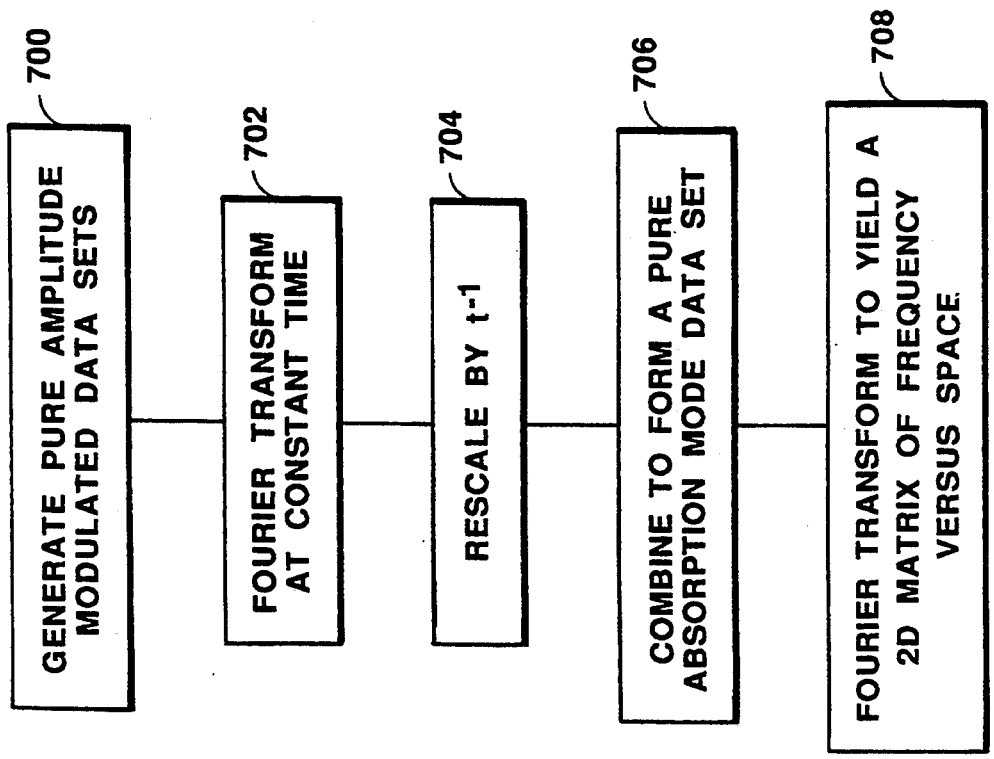
FIG. 7A is a schematic block diagram of the steps involved in the data analysis sequence used in the inventive shimming method.
Figure 7B:
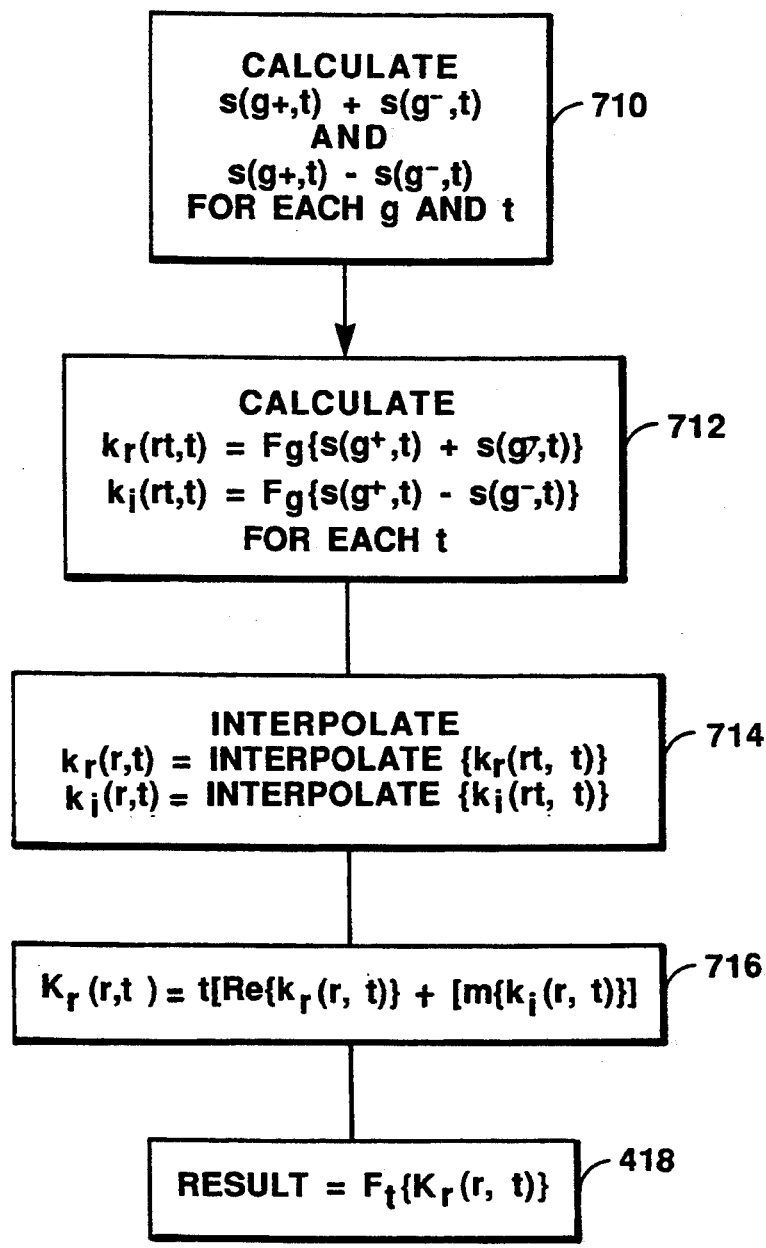
FIG. 7B is a more detailed schematic block diagram of the steps involved in the data analysis sequence shown in FIG. 7A.

The data analysis shown in schematic form in FIG. 5, steps 502–506 is shown in more detail in FIGS. 7A and 7B, with the assumption that the inhomogeneities to be corrected are along the z-axis. More particularly, the time domain FID response of an NMR-active sample to a single $\pi/2$ excitation pulse in the presence of a positive (increases in the same direction as the main static field) time-independent gradient is:

$$s(g^+,t) = \int_\Omega \rho(r)\exp\left(-\frac{t}{T_2}\right)\exp(-i\omega(z)t)\exp(-igzt) \quad [1]$$

and the corresponding FID in the presence of a negative gradient is:

$$s(g^-,t) = \int_\Omega \rho(r)\exp\left(-\frac{t}{T_2}\right)\exp(-i\omega(z)t)\exp(-igzt) \quad [2]$$

where $\rho(r)$ is the spatially-dependent spin density, r is a three-dimensional vector (x, y, z), $\omega(z)$ is the NMR resonant frequency which is dependent of the z-axis position due to the gradient and main field inhomogeneities, g is the gradient field strength and $T_2$ is the spin-spin relaxation time for the sample.

Figure 8B:
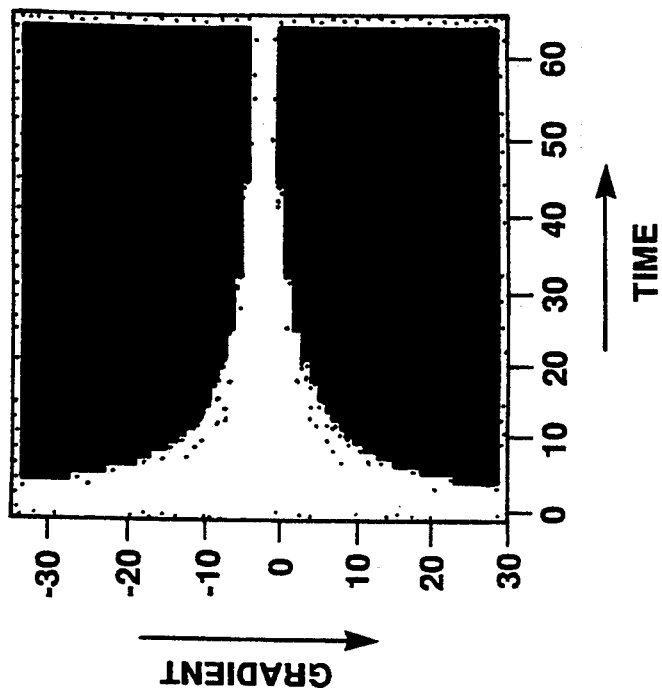
FIG. 8B is a two dimensional plot obtained by observing the three-dimensional plot in FIG. 8A by looking "down" along the Z-axis.
Figure 8A:
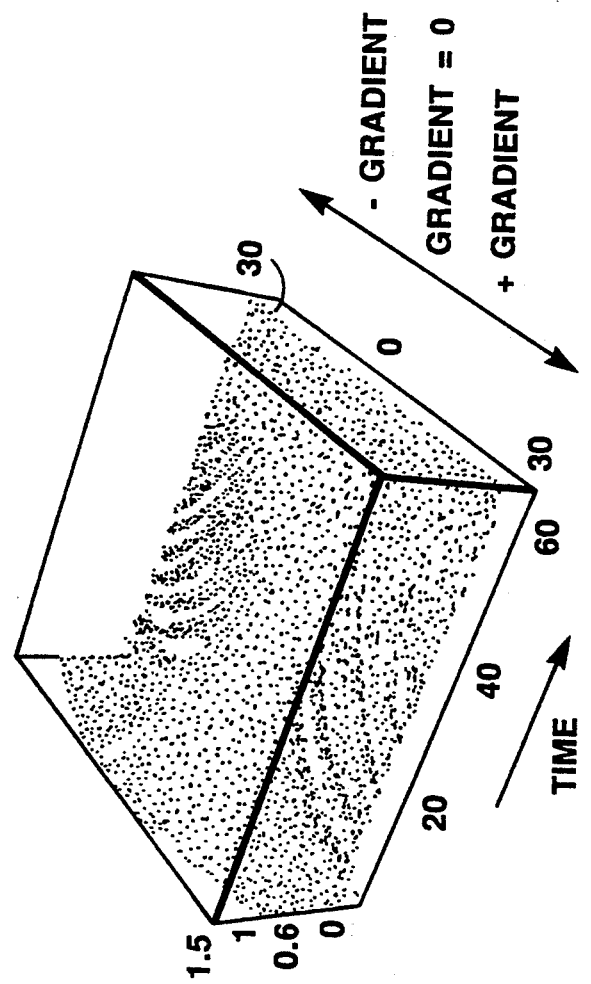
FIG. 8A is a three dimensional "gray-scale" plot of data obtained using the measurement sequence disclosed in FIG. 6 with an inhomogeneous magnetic field.

FIG. 8A shows illustrative data from a plurality of experiments each of which is schematically illustrated in FIG. 2. The data was recorded using the method illustrated in FIG. 6 and, illustratively, 64 experiments were used. The FID data for the 64 experiments is plotted on a three-dimensional plot in which the "x" axis represents time, the "y" axis represents field gradient strength with both positive and negative values and the "z-axis" represents the magnitude of the resonant signal.

In order to make the representation of the plot easier to understand, FIG. 8B is a "gray-scale" plot of FIG. 8A looking "down" along the "z-axis". In this plot, the magnitude of each point is represented by the shading of each point with the higher magnitude point being represented by lighter colored points and the lower magnitude points being represented by darker colored points. This same "gray-scale" plot is used in FIGS. 9-11 and 13. The horizontal end vertical axes represent the quantities marked and increasing in the directions of the arrows as shown on the Figures. The axes are divided into arbitrary divisions.

In FIG. 8B, the horizontal axis represents time and the vertical axis represents gradient strength. The measurement method shown in FIG. 6 involves a change in the gradient sign from negative to positive over the series of experiments conducted to gather the initial data. As previously mentioned, the spin evolution is caused by a combination of gradient evolution and evolution dependent on the spatial field variations. The change in sign of the gradient term allows the recovery of quadrature information from the phase-encoded domain.

The data shown in FIG. 8B can be manipulated in accordance with the procedure set forth in FIGS. 7A and 7B. The first step shown in FIG. 7A, step 700, is to generate data sets consisting of pure amplitude modulations of the signals. This can be done as illustrated in FIG. 7B, step 710, by selectively combining the time domain responses of the sample in the presence of the positive gradient with the responses of the sample in the presence of the negative gradient. The combinations involve adding the two response data sets as illustrated in FIG. 7B, step 710 as follows:

$$s(g^+,t) + s^*(g^-,t) = \quad [3]$$

$$2 \int_\Omega \rho(r) \exp\left(-\frac{t}{T_2}\right) \exp(-i\omega(z)t)\cos(gzt)$$

and subtracting the two data sets as follows:

$$s(g^+,t) - s^*(g^-,t) = \quad [4]$$

$$2i \int_\Omega \rho(r) \exp\left(-\frac{t}{T_2}\right) \exp(-i\omega(z)t)\sin(gzt)$$

for each g and t. The combined data sets represented by equations [3] and [4] are then Fourier transformed at constant time with respect to the gradient yielding new data sets that are scaled as space times time (rt, as illustrated in FIG. 7A, step 702). More particularly, a pure cosine Fourier transformation of a function such as p(r) cos(g z t) with respect to the gradient g returns p(rt). In the case of the data sets represented by equations [3] and [4], the Fourier transformation yields the real and imaginary components illustrated in FIG. 7B, step 712:

$$k_r(rt,t) = F_g\{s(g^+,t) + s^*(g^-,t)\} \quad [5]$$

and $$k_i(rt,t) = F_g\{s(g^+,t) - s^*(g^-,t)\} \quad [6]$$

Figure 9:
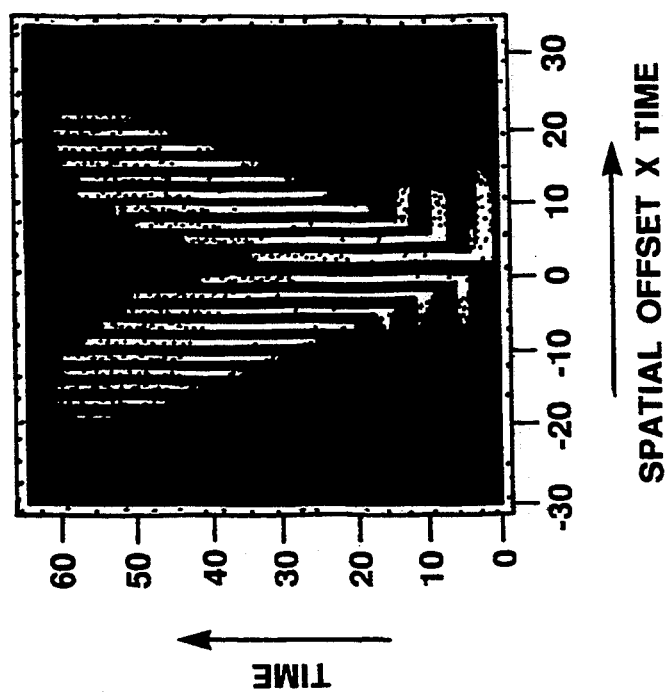
FIG. 9 is the two dimensional data plot illustrated in FIG. 8 after a first Fourier transformation has been performed on the data.

These components are shown in FIG. 9 which illustrates the Fourier-transformed data for the data set shown in FIG. 8. To allow a two-dimensional Fast Fourier transformation analysis, these components must be rescaled by $t^{-1}$ as shown in FIG. 7A, step 704 to yield function of (r,t) and the real and imaginary components can be combined as in step 706 to produce a pure absorption mode data set. This rescaling can be accomplished via an interpolation step as set forth in FIG. 7B, step 714, and the real and imaginary components can be combined as set forth in FIG. 7B, step 716 to yield a scaled data set:

$$k(r,t) = t[Re\{k_r(r,t)\} + Im\{k_i(r,t)\}] \quad [7]$$

Figure 10:
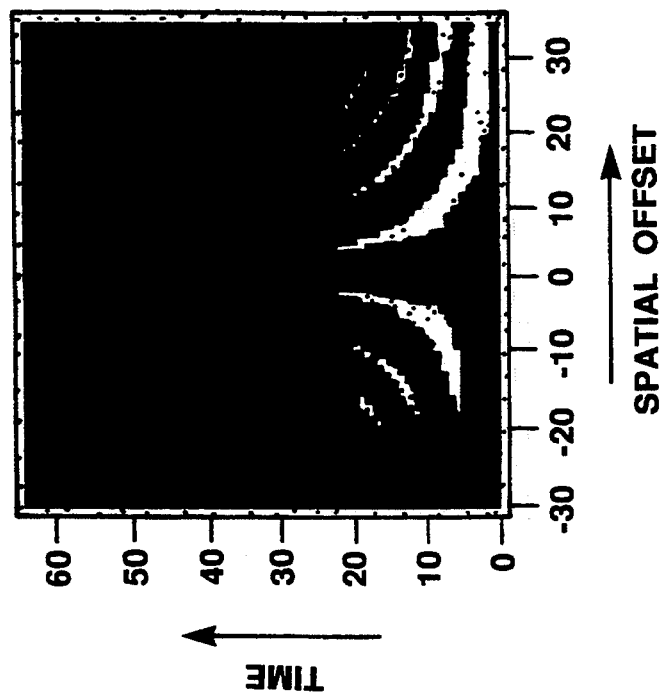
FIG. 10 is the two dimensional data plot illustrated in FIG. 9 after rescaling has been performed.

This scaled data set is shown in FIG. 10 for the real and imaginary components shown in FIG. 9.

In accordance with FIG. 7A, step 708, the data is then Fast Fourier transformed with respect to time to yield the desired matrix of offset along z and frequency:

$$\text{result} = F_t\{K_r(r,t)\} \quad [8]$$

Figure 11:
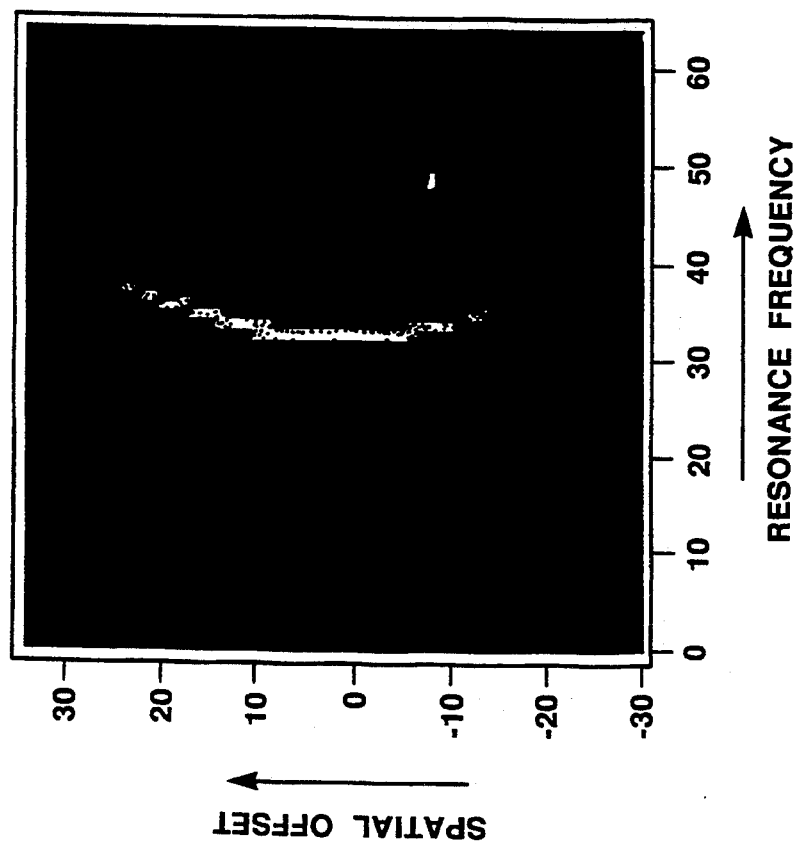
FIG. 11 is the two dimensional data plot illustrated in FIG. 10 after a second Fourier transformation has been performed on the data.

The transformed result of the scaled data illustrated in FIG. 10 is shown in FIG. 11. The horizontal axis of FIG. 11 represents z-offset and the vertical axis represents the frequency offset.

The data analysis method illustrated in FIGS. 7A and 7B is similar to a data analysis method which is used to process data acquired in experiments where the interest was to measure a spatially varying chemical shift, and the analysis is described in more detail in a paper entitled "Chemical-Shift-Resolved Back-Projection Imaging" by D. G. Cory, J. B. Miller, A. N. Garroway, and W. S. Veeman in the *Journal of Magnetic Resonance*, 85, 219-227 (1989), which paper is hereby incorporated by reference.

Having obtained this transformed data matrix, for each value of the spatial offset, z, the matrix is scanned and the corresponding resonance frequency is selected, which selected value is directly proportional to the magnetic field strength. These selected frequencies are then converted to magnetic field units via the known gyromagnetic ratio of the sample to arrive at the field strength field(r) versus z-offset as illustrated in FIG. 5, step 506.

As shown in FIG. 11, the field map is a broad line. As will be hereinafter discussed, in order to adjust the shim coil currents, it is necessary to fit the field map line to a curve with known coefficients. In turn, in order to curve fit the field map, it is necessary to select a single field value for each spatial point. The easiest method to do this is to select the point on the field map curve with the highest magnitude or the most intense field strength. However, in fields that are substantially inhomogeneous, the selection of the points on the curve is complicated by various "artifacts" produced by interpolation errors.

To perform the point selection, a recursive function is used. The recursive function is a conventional function which receives as an argument a position value and examines the field strength values of a selected point directly above (or below) the argument position and the field strength values of the two horizontal neighbors on either side the selected point. The function returns the largest value of the examined points. To start, it is assumed that the most intensive point on the entire map is on the field line and not on an artifact line and the position of this point is discovered by examining all of the field values. Once the most intense point is found, the aforementioned function can be used recursively (the function calls itself) to move along the field line first in the upwards direction from the most intense point and then in the downwards direction from the most intense point. When the maximum and minimum z values are reached in the respective cases, the desired frequency points have been selected.

Figure 12:
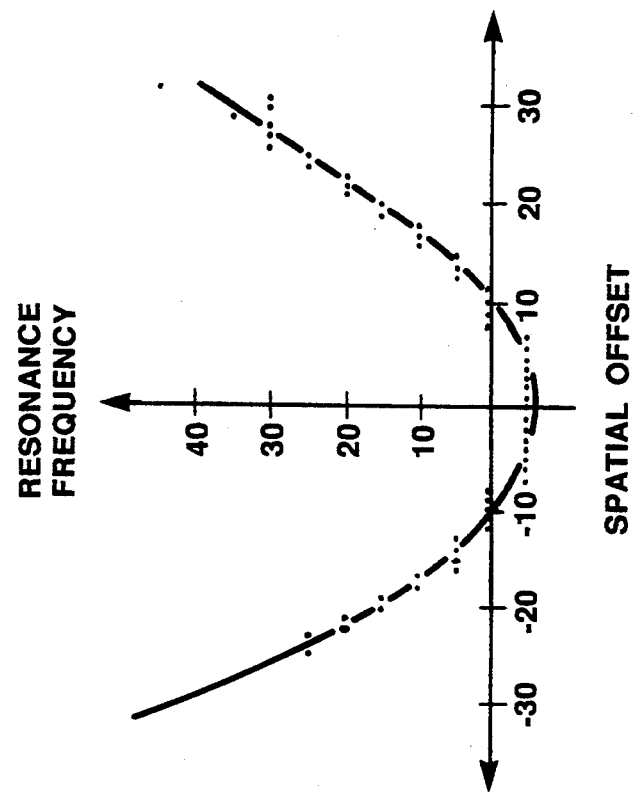
FIG. 12 is a plot of the magnetic field variation over the width of the sample as measured from the above data set showing a polynomial curve fit to the data with a least-squares fit.

The next step as illustrated in FIG. 5, step 508, is to fit the field variation data to a continuous function which is a weighted sum of the gradient shapes. This can be in a straightforward manner by various conventional means. For example, a "least-squares" curve fitting operation can be used to fit a curve with known coefficients to the data set arrived at in FIG. 5, step 508. Such a mathematical operation is well-known and will not be described further herein. The least squares fit generates a set of functions that describe the spatial dependence of the magnetic field as a function of position or z-offset. In addition, the individual function values of the field map can be weighted with their intensity to incorporate an assumption that the stronger data points are more reliable. FIG. 12 illustrates a typical curve generated by the least-squares-fit technique wherein the horizontal axis is z-offset and the vertical axis corresponds to magnetic field strength.

These calculated functions are, in turn, used to calculate the shim coil currents needed to correct the main static magnetic field to a homogeneous field as illustrated in FIG. 5, step 510. The shim coil currents are set by the computer which controls the NMR spectrometer in a conventional fashion to the desired values to correct for inhomogeneities in the main field during spectrometer operation.

Figure 13:
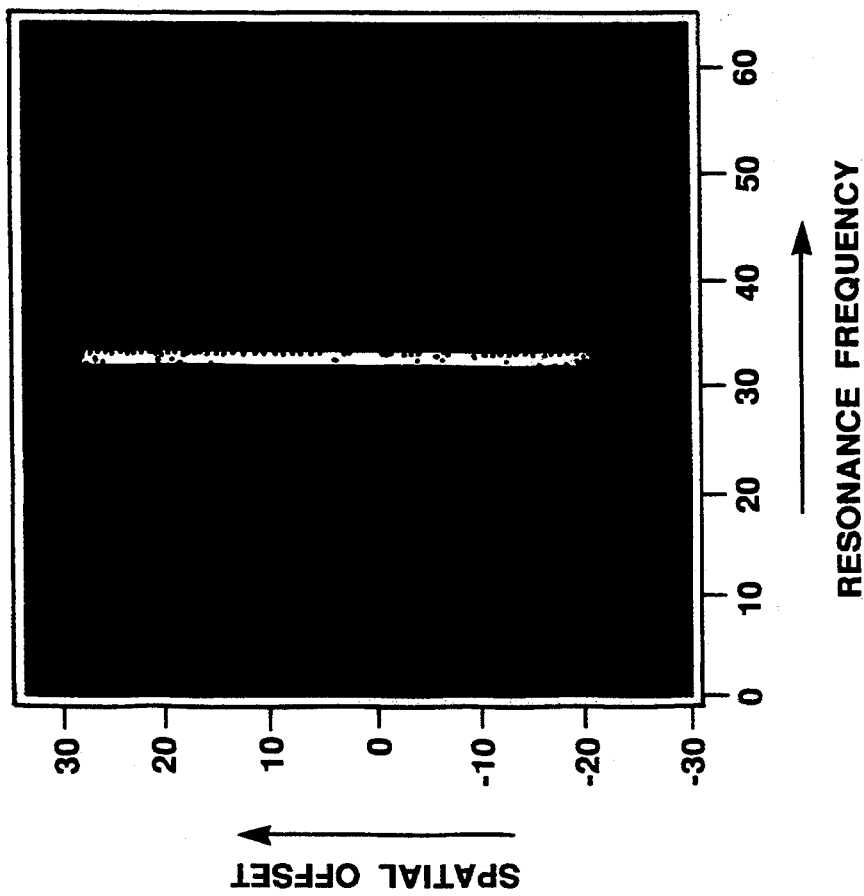
FIG. 13 is a two dimensional data plot of data after a second Fourier transformation has been performed on the data in a manner similar to that shown in FIG. 11, but taken over data acquired after the magnet homogeneity has been adjusted according to the parameters determined from the least-squares polynomial fit illustrated in FIG. 12.

After correcting the shim currents, the measurement process can be repeated and in this case a homogeneous field plot is observed as illustrated in FIG. 13.

Figure 14:
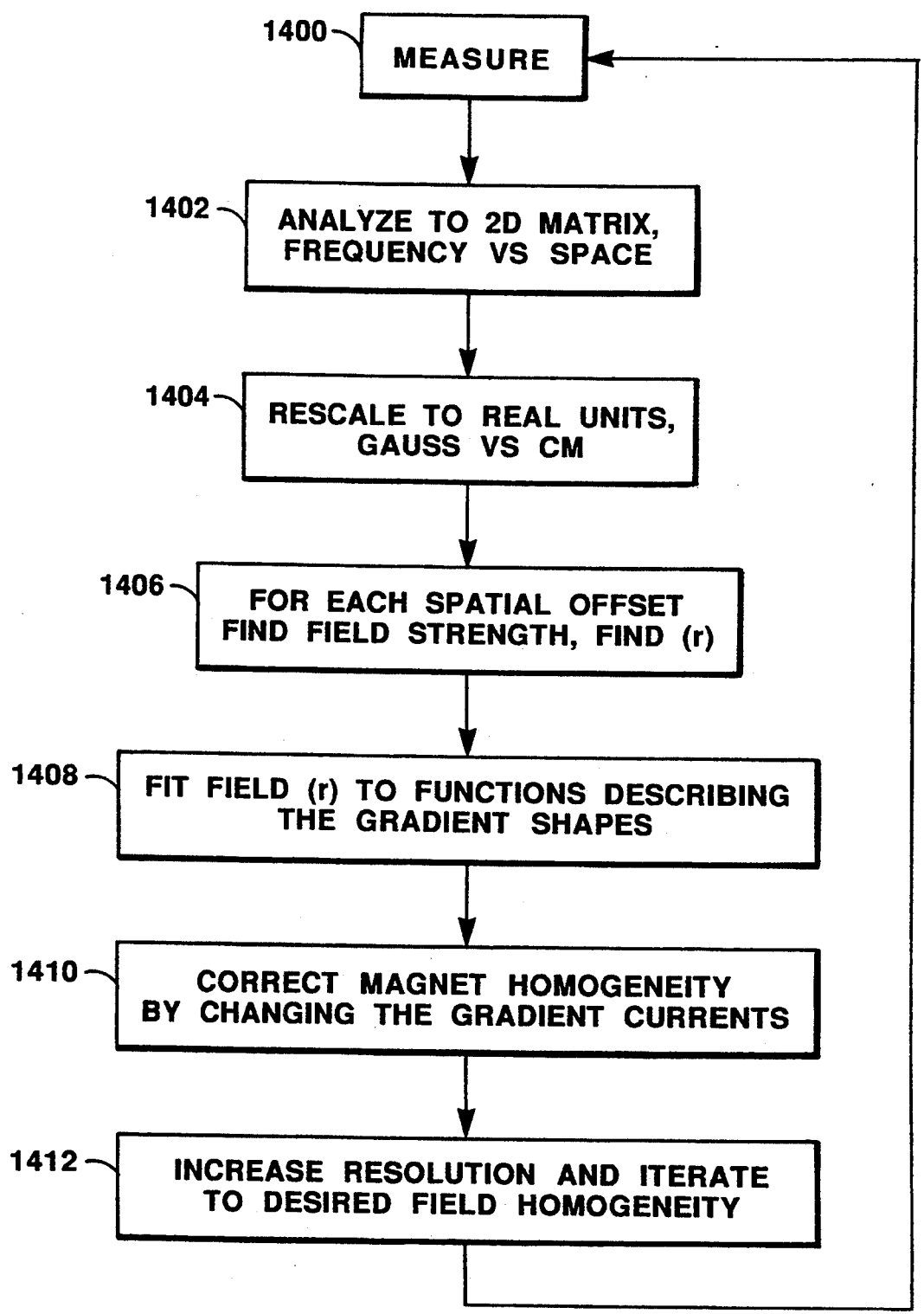
FIG. 14 is a schematic block diagram illustrating steps of an iterative sequence for fitting a polynomial curve to the transformed data.

As a practical matter, it is often necessary to use an iterative approach as outlined in FIG. 14 in order to adjust a spectrometer which uses both lower-order and higher-order shims, since the higher-order shims produce smaller field strength corrections than do the low-order shims. Consequently, it is necessary to first correct the low-order shims, and then increase the resolution of the method to correct the high-order shims. The resolution is set by the step size of the shim. This approach is illustrated in FIG. 14 wherein steps 1400-1410 correspond to equivalent steps 500-510 of FIG. 5, discussed above, and a new iteration step 1412 has been added to illustrate iteration of the method with increasing resolution.

Figure 15:
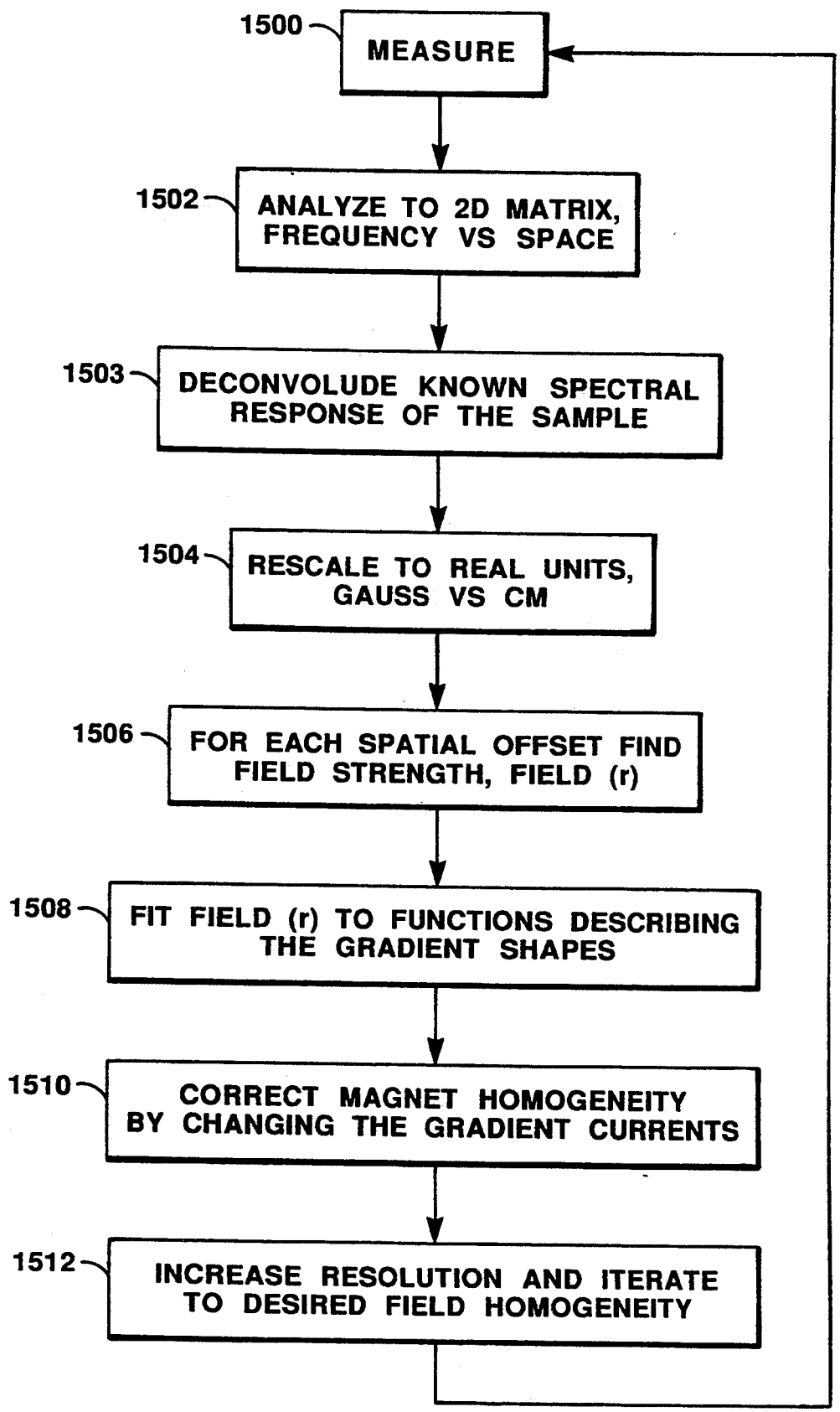
FIG. 15 is a schematic block diagram illustrating steps of a sequence for fining a one-dimensional polynomial curve to the transformed data, which sequence includes a spectral deconvolution step for removing complexities in the data introduced by a sample which has a complex spectrum.

In accordance with another embodiment of the invention, a deconvolution step can be included as shown in FIG. 15 for the case where the frequency spectrum of the sample used to make the measurements is not a single resonance, but a more complex spectrum. In this case, an additional step, 1503, is added to the method illustrated in FIG. 14 to remove the additional spectral complexities introduced by the sample spectrum. Except for the addition of step 1503, the illustrated method in the same as that shown in FIG. 14. In particular, in steps 1500-1502, the same actions are performed as performed in steps 1400-1402 and, in steps 1504-1512, the same actions are performed as performed in steps 1404-1412, respectively.

In other embodiments, the axis along which the gradient is measured may be vaned. Also, it may be necessary to repeat the measurement a number of times along a given axis with the resolution increased in successive measurements to more accurately adjust higher-order shims which typically have a smaller influence on the field homogeneity and are, therefore, more difficult to measure.

What is claimed is:

1. In an NMR spectrometer having coils for generating a main magnetic field having a direction over a sample volume, means for passing field current through the coils, a gradient coil, means for passing a gradient current through the gradient coil to generate a magnetic field gradient along a predetermined direction within the sample volume, a method for correcting the main magnetic field to a spatially uniform field along the predetermined direction over the sample volume by selectively adjusting the magnitude of the field current, the method comprising the steps of:

A. inserting a material sample containing NMR-active nuclei into the sample volume;
   B. setting the gradient current to a predetermined value;
   C. performing an NMR experiment to acquire a frequency spectrum data set of the sample while the gradient current remains at the predetermined value set in step B;
   D. adjusting the gradient current to a new value to change the gradient field;
   E. repeating steps C and D a predetermined number of times to acquire multiple frequency spectrum data sets with different times and gradient field magnitudes;
   F. manipulating the frequency spectrum data sets acquired in step E to produce a new data set relating field strength to spatial position; and
   G. using the new data set produced in step F to adjust the magnitude of the field current.

2. In an NMR spectrometer, the method according to claim 1 wherein step D comprises the step of:
   D1. incrementing the gradient coil current between NMR experiments.

3. In an NMR experiment, the method according to claim 1 wherein step F comprises the steps of:
   F1. generating amplitude modulated data sets;
   F2. Fourier transforming the amplitude modulated data sets generated in step F1 at constant time to produce first Fourier transform results;
   F3. processing the first Fourier transform results in step F2 to obtain a pure absorption mode data set; and
   F4. Fourier transforming the pure absorption mode data set generated in step F3 to generate the new data set relating field strength to spatial position.

4. In an NMR spectrometer, the method according to claim 3 wherein step F1 comprises the step of:
   F1A. generating quadrature data by selectively combining the frequency spectrum data sets acquired in step E for each time and gradient field.

5. In an NMR spectrometer, the method according to claim 4 wherein step F2 comprises the step of:
   F2A. calculating the real and imaginary parts of the Fourier transformation of the quadrature data generated in step F1A.

6. In an NMR spectrometer, the method according to claim 5 wherein step F3 comprises the steps of:
   F3A. scaling the real and imaginary parts calculated in step F2A; and
   F3B. combining the scaled real and imaginary parts to form the pure absorption mode data set.

7. In an NMR spectrometer having coils for generating a main magnetic field having a direction over a sample volume, a shim coil for generating a shim field within the sample volume, and means for passing a shim current with a selected magnitude through the shim coil, a method for correcting the main magnetic field to a spatially uniform field along a predetermined direction over the sample volume by selectively adjusting the magnitude of the shim current, the method comprising the steps of:

A. inserting a material sample containing NMR-active nuclei into the sample volume;
B. setting the shim current to a predetermined value;
C. performing an NMR experiment to acquire a frequency spectrum data set of the sample;
D. adjusting the shim current to a new value;
E. repeating steps C and D a predetermined number of times to acquire multiple frequency spectrum data sets;
F. manipulating the frequency spectrum data sets acquired in step E to produce a new data set relating field strength to spatial position;
G. using the new data set produced in step F to adjust the magnitude of the shim coil current.

8. In an NMR spectrometer, the method according to claim 7 wherein step D comprises the step of:

D1. adjusting the shim current so that the shim coil produces a shim field having a magnitude which varies linearly along the predetermined direction.

9. In an NMR spectrometer, the method according to claim 7 wherein step E comprises the step of:

E1. repeating the NMR experiment a sufficient number of times in order to acquire data sets in which the shim field increases in magnitude along the predetermined direction and data sets in which the shim field decreases in magnitude along the predetermined direction.

10. In an NMR spectrometer, the method according to claim 9 wherein step F comprises the steps of:

F1. selectively combining data sets in which the shim field is aligned with the main magnetic field with data sets in which the shim field is opposed to the main magnetic field to form a plurality of combined sets;
F2. Fourier transforming each of the plurality of combined sets formed in step F1 to form a first transformed result;
F3. rescaling the first transformed result generated in step F2;
F4. Fourier transforming the rescaled result formed in step F3 to generate a second transformed result; and
F5. using the second transformed result of step F4 to control the means for passing a shim current through the shim coil.

11. In an NMR spectrometer, the method according to claim 10 wherein step F1 comprises the steps of:

F1A. forming the sum of data sets in which the shim field is aligned with the main magnetic field with data sets in which the shim field is opposed to the main magnetic field; and
F1B. forming the difference between data sets in which the shim field is aligned with the main magnetic field and data sets in which the shim field is opposed to the main magnetic field.

12. In an NMR spectrometer, the method according to claim 11 wherein step F3 comprises the steps of:

F3A. using an interpolation function to rescale the Fourier transformed results of step F2 by the value $[t^{-1}]$ $t/1$, where t represents time.

13. In an NMR spectrometer, the method according to claim 10 wherein step F5 comprises the steps of:

F5A. fitting a mathematical function to the second transformed result produced in step F4; and
F5B. using the function determined in step F5A to control the means for passing a shim current through the shim coil.

14. In an NMR spectrometer, the method according to claim 13 wherein step F5A comprises the steps of:

F5A1. fitting a mathematical function to the second transformed result by means of a least squares operation.

15. In an NMR spectrometer, the method according to claim 13 wherein step F5A comprises the step of:

F5A2. selecting data points in the second transformed result for each position which have the largest magnitude.

16. In an NMR spectrometer, the method according to claim 10 wherein step F3 comprises the steps of:

F3B. deconvolving the Fourier transformed results with a predetermined spectral response of the material sample.

17. In an NMR spectrometer, the method according to claim 10 further comprising the steps of:

H. increasing the resolution of the NMR spectrometer; and
I. repeating steps A through G.

18. In an NMR spectrometer, the method according to claim 7 wherein step C comprises the step of:

C1. spinning the sample during acquisition of an NMR signal.

19. In an NMR spectrometer, the method according to claim 7 wherein step C comprises the step of:

C2. acquiring the frequency spectrum data at an NMR resonant frequency.

20. In an NMR spectrometer having coils for generating a main magnetic field having a z-axis direction over a sample volume, a z-shim coil for generating an on-axis shim field within the sample volume, and means for passing a first shim current with a selected magnitude through the z-shim coil, a plurality of additional shim coils, means for passing a plurality of second shim currents through the plurality of additional shim coils, a method for correcting the main magnetic field to a spatially uniform field along the z-axis direction over the sample volume by selectively adjusting the magnitude of the first shim current and the plurality of second shim currents, the method comprising the steps of:

A. inserting a material sample containing NMR-active nuclei into the sample volume;
B. setting the first shim current to a predetermined value;
C. exciting the sample nuclei at an NMR resonant frequency and detecting a free induction decay signal to acquire a frequency spectrum data set of the sample;
D. incrementing the first shim current to a new value;
E. repeating steps C and D a predetermined number of times to acquire multiple frequency spectrum data sets;
F. Fast Fourier transform the multiple frequency data sets acquired in step E to generate first transformed data;
G. interpolating the first transformed data to generate field map data representing magnetic field strength versus position;
H. selecting data points in the field map data generated in step G for each position which have the largest field magnitude;

I. fitting a curve to the data points selected in step H to obtain coefficients describing the shim coil currents necessary to correct inhomogeneities in the main magnetic field; and J. using the coefficients obtained in step I to adjust the magnitude of the first shim coil current and the magnitude of the plurality of second shim coil currents.

21. In an NMR spectrometer, the method according to claim 20 wherein step F comprises the steps of:
F1. generating quadrature data by selectively combining the frequency spectrum data sets acquired in step E for each time and gradient field.
F2. Fourier transforming the quadrature data generated in step F1 at constant time to produce first Fourier transformed results;

22. In an NMR spectrometer, the method according to claim 21 wherein step F further comprises the step of:
F3. calculating the real and imaginary parts of the Fourier transformation of the quadrature data generated in step F2.

23. In an NMR spectrometer, the method according to claim 22 wherein step G comprises the steps of:
G1. scaling the real and imaginary parts calculated in step F3;
G2. combining the scaled real and imaginary parts to form the pure absorption mode data set; and
G3. Fourier transforming the pure absorption mode data set to generate the field map data.

24. In an NMR spectrometer, the method according to claim 23 wherein step I comprises the step of:
I1. using a least squares curve fitting method.

25. In an NMR spectrometer, the method according to claim 24 wherein step C comprises the step of:
C1. spinning the sample.

* * * * *